(12) United States Patent
Zheng et al.

(10) Patent No.: US 9,282,633 B2
(45) Date of Patent: Mar. 8, 2016

(54) ROUTING STRUCTURE AND DISPLAY PANEL

(75) Inventors: Hua Zheng, Guandong (CN); Cheng-hung Chen, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 196 days.

(21) Appl. No.: 13/519,374

(22) PCT Filed: Jun. 11, 2012

(86) PCT No.: PCT/CN2012/076685
§ 371 (c)(1),
(2), (4) Date: Jun. 27, 2012

(87) PCT Pub. No.: WO2013/177822
PCT Pub. Date: Dec. 5, 2013

(65) Prior Publication Data
US 2013/0319745 A1    Dec. 5, 2013

(51) Int. Cl.
*H05K 1/11*    (2006.01)
*H05K 1/02*    (2006.01)

(52) U.S. Cl.
CPC ............ *H05K 1/0269* (2013.01); *H05K 1/0289* (2013.01); *H05K 2201/09281* (2013.01); *H05K 2201/09936* (2013.01)

(58) Field of Classification Search
CPC ......... H05K 1/05; H05K 1/053; H05K 1/056; H05K 1/092; H01B 1/14; H01B 1/16; H01B 1/20; H01B 1/22
USPC .......... 174/261, 250, 251, 253, 255–257, 268
See application file for complete search history.

(56) References Cited

U.S. PATENT DOCUMENTS

| | | | |
|---|---|---|---|
| 2006/0256537 A1* | 11/2006 | Muroki | 361/739 |
| 2009/0084583 A1* | 4/2009 | Ueno | 174/254 |
| 2010/0012356 A1* | 1/2010 | Hasegawa | 174/255 |
| 2011/0139493 A1* | 6/2011 | Sumida et al. | 174/254 |
| 2011/0253789 A1* | 10/2011 | Thiele et al. | 235/441 |

FOREIGN PATENT DOCUMENTS

| CN | 101290406 A | 10/2008 |
|---|---|---|
| CN | 101441376 A | 5/2009 |

* cited by examiner

*Primary Examiner* — Tremesha S Willis
(74) *Attorney, Agent, or Firm* — Andrew C. Cheng

(57) ABSTRACT

The present invention provides a routing structure and display panel. The routing structure includes a plurality of routing, disposed separately. Each routing corresponds to a symbol, and the symbol is disposed on the routing to act as a part of the routing to conduct electricity. In this manner, the routing structure and display panel of the present invention allow expansion of routing width, effectively reduce RC constant and energy-consumption, and improve yield rate.

18 Claims, 4 Drawing Sheets

ROUTING STRUCTURE AND DISPLAY PANEL

BACKGROUND OF THE INVENTION

1. Field of the Invention

The present invention relates to the field of liquid crystal displaying techniques, and in particular to a routing structure and a display panel.

2. The Related Arts

At present, routing and marking of display panel usually uses the following technique: metal routing and the adjacent digit symbol are formed with the same metal (such as, AL, Cu, Cr) in the same manufacturing process. Metal routing and adjacent digit symbol are arranged in a one-to-one correspondence and yet separate manner.

To achieve high display quality and low manufacture cost, routing space reserved on display panel is usually small. In particular, routing space for fan-out of wire bonding to external chips is extremely limited. In such a small space, in addition to layout of a plurality of metal routing, space must also be reserved for digit symbols, which results in width of metal routing becoming very small (about 2-200 um).

However, small width of metal routing is not only difficult for manufacture, but also reduces yield rate. In addition, resistance of metal routing will increase, leading to increased RC constant and energy-consumption, and eventually insufficient charge of pixel and poor area heat-dissipation problems in display panels.

Thus, it is desired to have a routing structure and display panel to solve the problem of small routing width of routing structure of know techniques.

SUMMARY OF THE INVENTION

The technical issue to be addressed by the present invention is to provide a routing structure and display panel. The routing structure and display allows increase in the width of routing.

The present invention provides a routing structure, which comprises: a plurality of routings, disposed separately, wherein each routing corresponding to a symbol, the symbol comprising at least a code, the code being a digit or a letter, wherein the symbol being disposed on the routing and symbol being conductive on extension direction of routing to serve as a part of routing to conduct electricity.

The present invention provides a routing structure, which comprises: a plurality of routings, disposed separately, wherein each routing corresponding to a symbol, the symbol being disposed on the routing and symbol being conductive on extension direction of routing to serve as a part of routing to conduct electricity.

According to a preferred embodiment of the present invention, the symbol comprises at least a code, and the code is a digital or a letter.

According to a preferred embodiment of the present invention, the symbol comprises a plurality of codes, and the plurality of codes being conductive on extension direction of routing.

According to a preferred embodiment of the present invention, direction of code is parallel to extension direction of routing.

According to a preferred embodiment of the present invention, direction of code is perpendicular to extension direction of routing.

According to a preferred embodiment of the present invention, width of code is greater than width of routing.

According to a preferred embodiment of the present invention, width of code is smaller than width of routing.

According to a preferred embodiment of the present invention, the codes are continuously disposed on the routing.

According to a preferred embodiment of the present invention, the codes are disposed separately on extension direction of routing.

The present invention provides a display panel, which comprises: a plurality of routings, disposed separately, wherein each routing corresponding to a symbol, the symbol being disposed on the routing and symbol being conductive on extension direction of routing to serve as a part of routing to conduct electricity.

According to a preferred embodiment of the present invention, the symbol comprises at least a code, and the code is a digital or a letter.

According to a preferred embodiment of the present invention, the symbol comprises a plurality of codes, and the plurality of codes being conductive on extension direction of routing.

According to a preferred embodiment of the present invention, direction of code is parallel to extension direction of routing.

According to a preferred embodiment of the present invention, direction of code is perpendicular to extension direction of routing.

According to a preferred embodiment of the present invention, width of code is greater than width of routing.

According to a preferred embodiment of the present invention, width of code is smaller than width of routing.

According to a preferred embodiment of the present invention, the codes are continuously disposed on the routing.

According to a preferred embodiment of the present invention, the codes are disposed separately on extension direction of routing.

According to a preferred embodiment of the present invention, the routing is a data line or a scan line.

The efficacy of the present invention is that to be distinguished from the state of the art. The routing structure and display panel of the present invention, through disposing symbol on the routing and using symbol as a part of routing to conduct electricity, allow expansion of routing width, effectively reduce RC constant and energy-consumption, and improve yield rate.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following refer to drawings and embodiments of the present invention.

Figure 1:
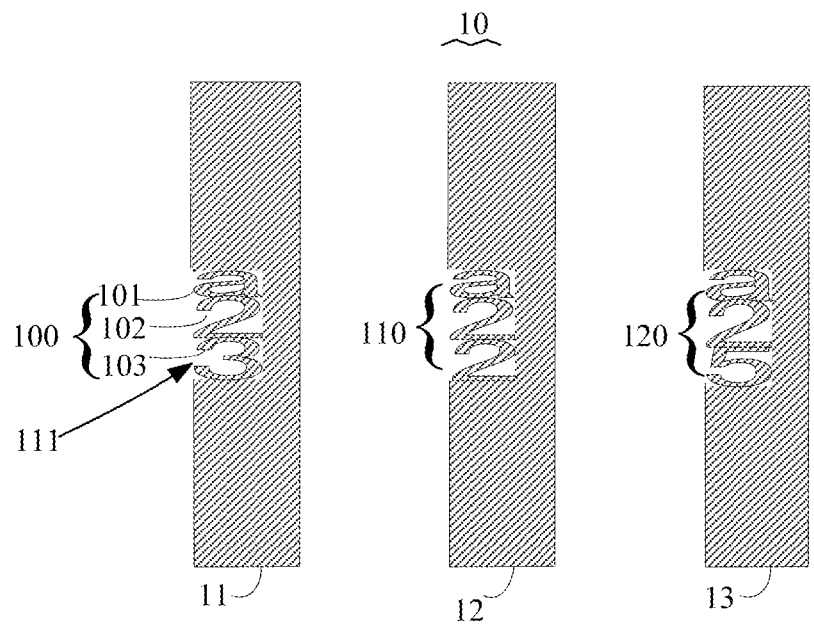
FIG. 1 is a schematic view showing the structure of the first embodiment of routing structure according to the present invention.

Referring to FIG. 1, FIG. 1 is a schematic view showing the structure of the first embodiment of routing structure according to the present invention. As shown in FIG. 1, routing structure 10 of the present embodiment comprises a plurality of routings 11, 12, 13, disposed separately. Each routing corresponds to a symbol, wherein routing 12 corresponds to symbol 110, routing 13 corresponds to symbol 120, and routing 11 corresponds to symbol 100; symbol 100, symbol 110 and symbol 120 are disposed respectively on routing 11, routing 12, and routing 13 to act as a part of routing 11, routing 12 and routing 13 to conduct electricity.

In the instant embodiment, each routing with corresponding symbol is disposed in the same manner. Hence, the following description uses routing 11 and symbol 100 as example for explanation.

In the present invention, each symbol comprises at least a code, and the code can be a digit or a letter of know techniques. As shown in FIG. 1, symbol 100 comprises code 101, code 102 and code 103. Code 101 is a letter, code 102 and code 103 are both digits. For example, code 101 is letter "a", code 102 is digit "2" and code 103 is digit "3".

To achieve the objective of acting as a part of routing 11 to conduct electricity, code 101, code 102 and code 103 are electrically connected along extension direction of routing 11. In the instant embodiment, code 101, code 102 and code 103 are continuously disposed on routing 11, and code 101, code 102 and code 103 are disposed in a direction in parallel with the extension direction ion of routing 11.

Specifically, routing 11 is disposed with a rectangular groove 111. Width of rectangular groove 111 is smaller than width of routing 11. Rectangular groove 111 is located on left part of routing 11. Code 101, code 102 and code 103 are continuously disposed inside rectangular groove 111 and both ends of symbol 100 (i.e., code 101 and code 103) are connected to routing 11. Width of code 101, code 102 and code 103 is smaller than width of routing 11.

Obviously, rectangular groove 111 can also be located on right part or center part of routing 11. As a variation, width of rectangular groove 111 can also be width of routing 11. In such a situation, width of code 101, code 102 and code 103 is effectively equal to width of routing 11.

To improve conductivity, the instant embodiment can also electrically connect one side of codes to routing 11. When width of rectangular groove 111 is smaller than width of routing 11 and rectangular groove 111 is located at the center part of routing 11, both sides of codes can be electrically connected to routing 11 to improve conductivity.

Figure 2:
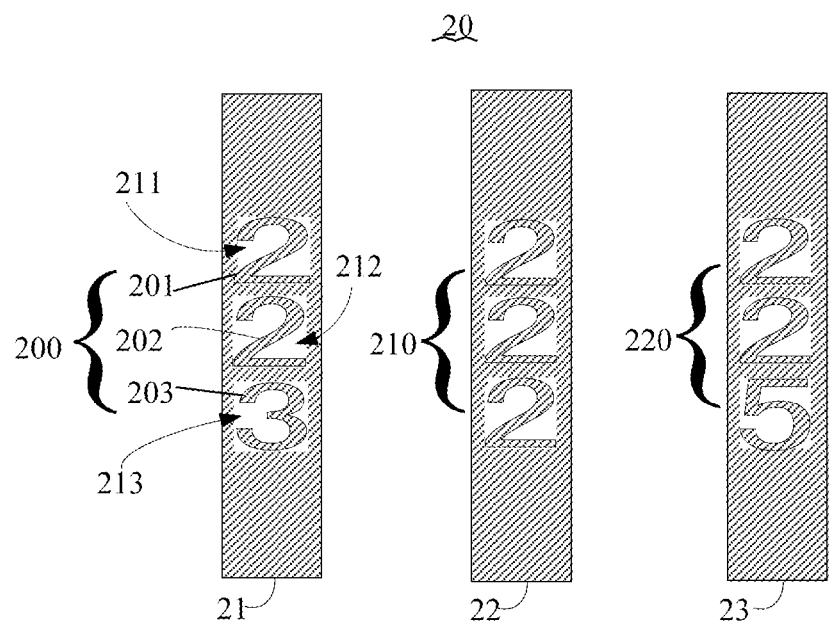
FIG. 2 is a schematic view showing the structure of the second embodiment of routing structure according to the present invention.

Referring to FIG. 2, FIG. 2 is a schematic view showing the structure of the second embodiment of routing structure according to the present invention. As shown in FIG. 2, routing structure 20 in FIG. 2 comprises routing 21, routing 22 and routing 23, wherein symbol 200, symbol 210 and symbol 220 are disposed respectively routing 21, routing 22 and routing 23.

In the instant embodiment of FIG. 2, each routing with corresponding symbol is disposed in the same manner. Hence, the following description uses routing 21 and symbol 200 as example for explanation.

In the instant embodiment, symbol 200 comprises code 201, code 202 and code 203; and code 201 is digit "2", code 202 is digit "2", and code 203 is digit "3".

In the instant embodiment, code 201, code 202 and code 203 are separately disposed on routing 21, and code 201, code 202 and code 203 are electrically connected along extension direction of routing 21 to act as a part of routing 21 to conduct electricity. Code 201, code 202 and code 203 are disposed in a direction in parallel with the extension direction ion of routing 21.

Specifically, routing 21 is disposed with three separate rectangular grooves 211, 212, 213. Width of rectangular grooves 211, 212, 213 is smaller than width of routing 21. Rectangular grooves 211, 212, 213 are located at center part of routing 21. Code 201, code 202 and code 203 are respectively disposed inside rectangular grooves 211, 212, 213 and both ends of each code are connected to routing 21. Width of code 201, code 202 and code 203 is smaller than width of routing 21.

Figure 3:
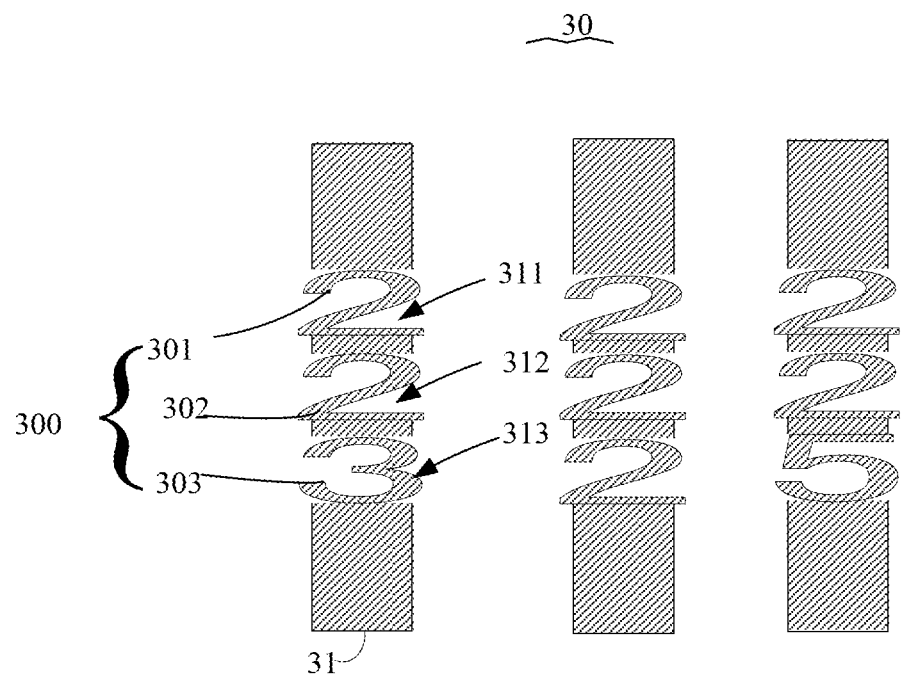
FIG. 3 is a schematic view showing the structure of the third embodiment of routing structure according to the present invention.

Obviously, rectangular grooves can also be located on left part or right part of routing 11. As a variation, width of rectangular grooves can also be width of routing 21. In such a situation, width of code 201, code 202 and code 203 is greater than or equal to width of routing 21. Specifically, refer to routing structure 30 of FIG. 3. As shown in FIG. 3, width of rectangular grooves 311, 312, 313 is equal to width of routing 31, and code 301, code 302, code 303 of symbol 300 have width greater than width of routing 31.

To improve conductivity, the instant embodiment can also electrically connect one side of codes to routing 21. When width of rectangular grooves 211, 212, 213 is smaller than width of routing 21 and rectangular grooves 211, 212, 23 are located at the center part of routing 21, both sides of codes can be electrically connected to routing 21 to improve conductivity.

Figure 4:
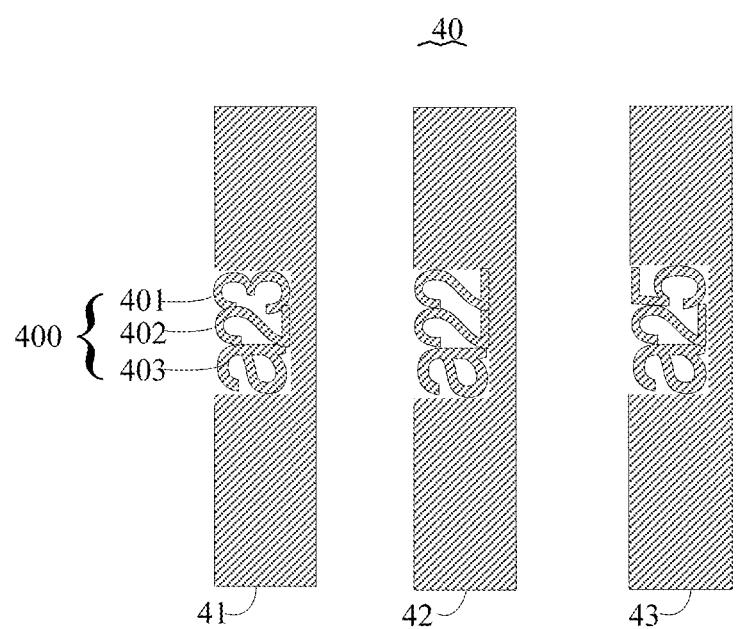
FIG. 4 is a schematic view showing the structure of the fourth embodiment of routing structure according to the present invention.

Referring to FIG. 4, FIG. 4 is a schematic view showing the structure of the fourth embodiment of routing structure according to the present invention. Routing structure 40 in FIG. 4 is obtained by rotating codes in FIG. 1 90° counterclockwise. As shown in FIG. 4, code 401, code 402 and code 403 are disposed in a direction perpendicular to extension direction of routing 41. Disposition of symbol on routing 42 and routing 43 is the same as disposition of symbol 400 on routing 41, and thus is not repeated here.

Obviously, as a variation, another routing structure can be obtained by rotating codes in FIG. 1 90° clockwise.

Similarly, as a variation, routing structures in FIG. 2 and FIG. 3 can also be rotated 90° clockwise or counterclockwise to obtain other routing structures.

Figure 5:
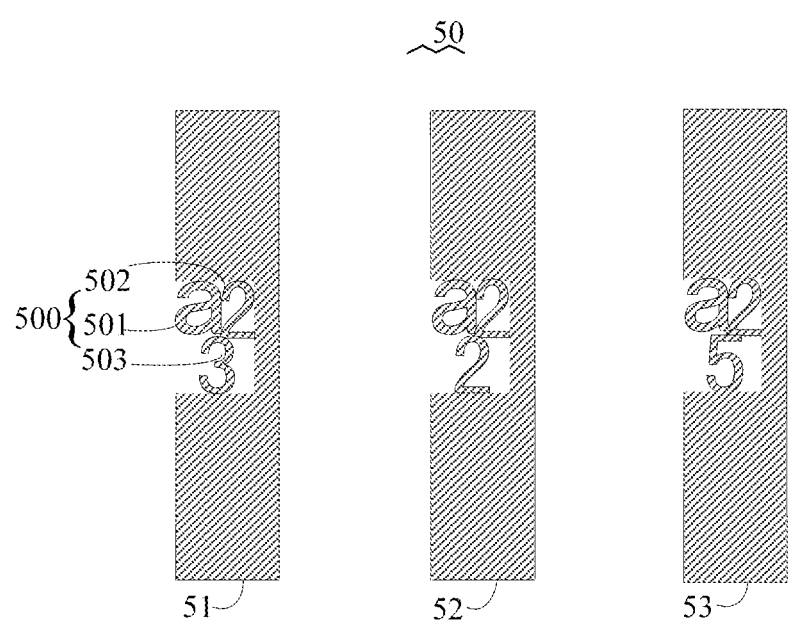
FIG. 5 is a schematic view showing the structure of the fifth embodiment of routing structure according to the present invention.

Referring to FIG. 5, FIG. 5 is a schematic view showing the structure of the fifth embodiment of routing structure according to the present invention. Routing structure 50 in FIG. 5 is obtained by varying routing structure 10 of FIG. 1.

In the instant embodiment, code 501 and code 502 are arranged in a side-by-side layout, and code 503 is disposed underneath code 501 and code 502.

Disposition of symbol on routing 52 and routing 53 is the same as disposition of symbol 500 on routing 51, and thus is not repeated here.

Routings and codes in all aforementioned embodiments use the same metal and same manufacturing process, preferably, Al, CU, or Cr.

Figure 6:
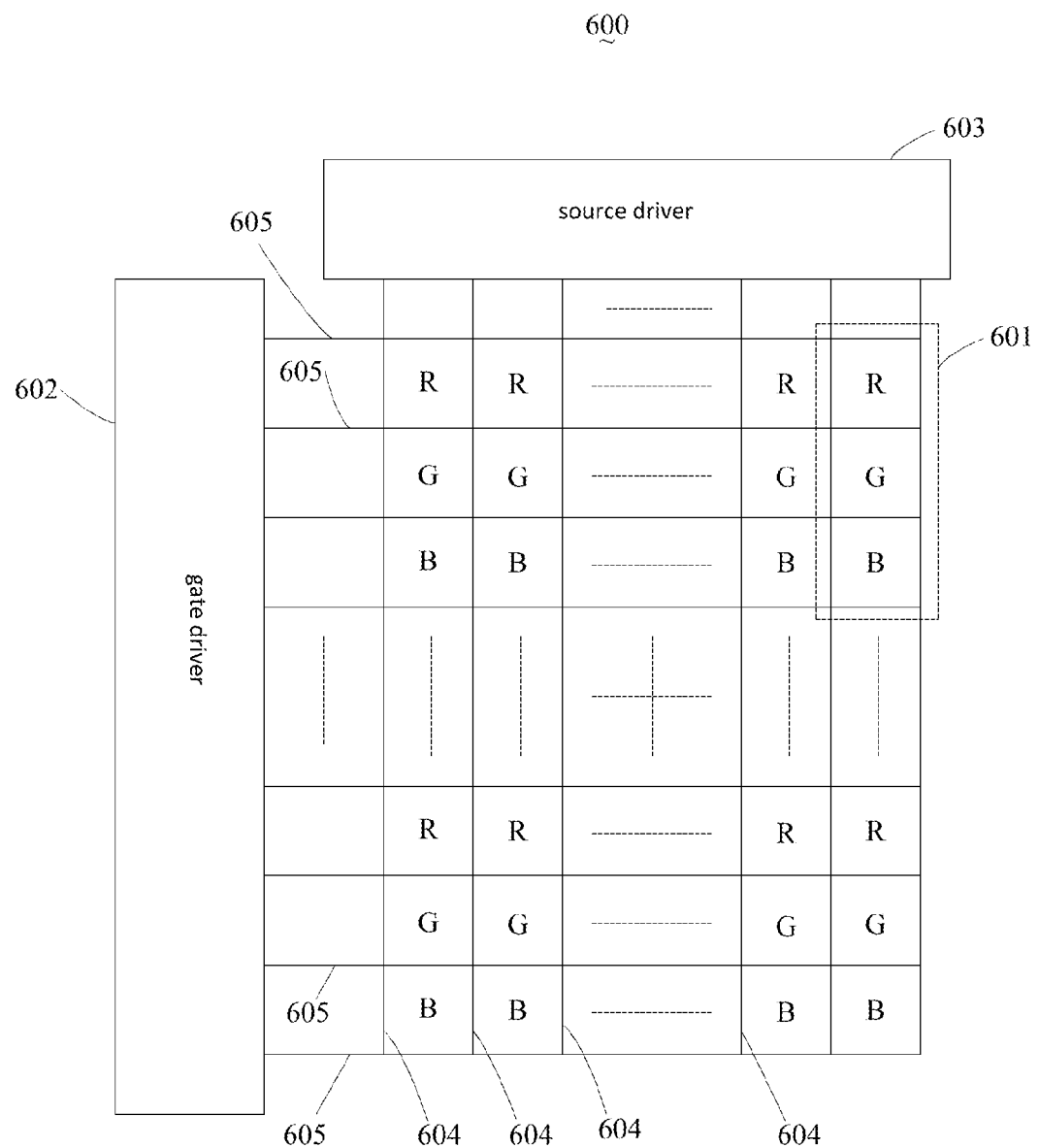
FIG. 6 is a schematic view showing the structure of the display panel according to the present invention.

Referring to FIG. 6, which is a schematic view showing the structure of a display panel of the present invention. As shown in FIG. 6, display panel 600 comprises: a plurality of pixel units 601, gate driver 602, source driver 603, a plurality of data lines 604 and a plurality of scan lines 605. For example, each of the pixel units 601 includes a red-pixel part (R), a green-pixel part (G) and a blue-pixel part (B).

In the instant embodiment, the plurality of scan lines 605 is disposed separately in parallel, the plurality of data lines 604 is disposed in insulated manner from the plurality of scan lines 605. The plurality of pixel units 601 is connected to gate driver 602 through the plurality of scan lines 605, and the plurality of pixel units 601 is connected to source driver 603 through the plurality of data lines 604.

Gate driver 602 supplies scan voltage to the plurality of pixel units 601 through the plurality of scan lines 605, and source driver 603 supplies drive voltage to the plurality of pixel units 601 through the plurality of data lines 604.

In the instant embodiment, scan lines 605 and data lines 604 can adopt any routing structure of the aforementioned embodiments.

In summary, the routing structure and display panel of the present invention, through disposing symbol on the routing and using symbol as a part of routing to conduct electricity, allow expansion of routing width, effectively reduce RC constant and energy-consumption, and improve yield rate.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A routing structure, which comprises: a plurality of routings, disposed separately, wherein each routing corresponds to a respective routing code, the routing code comprising a plurality of characters, each character being a digit or a letter, wherein the routing code is disposed in a groove of the corresponding routing and connected to the corresponding routing, wherein the routing code and the corresponding routing are made of the same metal and the routing code is made conductive in an extension direction of the routing to serve as a part of the routing to conduct electricity.

2. A routing structure, which comprises: a plurality of routings, disposed separately, wherein each routing corresponds to a respective routing code, the routing code being disposed in a groove of the corresponding routing and connected to the corresponding routing, the routing code and the corresponding routing being made of the same metal and the routing code being conductive in an extension direction of the routing to serve as a part of the routing to conduct electricity.

3. The routing structure as claimed in claim 2, characterized in that the routing code comprises a plurality of characters, and each character is a digit or a letter.

4. The routing structure as claimed in claim 3, characterized in that a direction of the characters is parallel to the extension direction of the routing.

5. The routing structure as claimed in claim 3, characterized in that a direction of the characters is perpendicular to the extension direction of the routing.

6. The routing structure as claimed in claim 3, characterized in that a width of each character is greater than a width of the routing.

7. The routing structure as claimed in claim 3, characterized in that a width of each character is smaller than a width of the routing.

8. The routing structure as claimed in claim 3, characterized in that the characters are continuously disposed on the routing.

9. The routing structure as claimed in claim 3, characterized in that the characters are separately disposed on the routing.

10. A display panel, which comprises: a plurality of routings, disposed separately, wherein each routing corresponds to a respective routing code, the routing code being disposed in a groove of the corresponding routing and connected to the corresponding routing, the routing code and the corresponding routing being made of the same metal and the routing code being conductive in an extension direction of the routing to serve as a part of the routing to conduct electricity.

11. The display panel as claimed in claim 10, characterized in that the routing code comprises a plurality of characters, and each character is a digit or a letter.

12. The display panel as claimed in claim 11, characterized in that a direction of the characters is parallel to the extension direction of the routing.

13. The display panel as claimed in claim 11, characterized in that a direction of the characters is perpendicular to the extension direction of the routing.

14. The display panel as claimed in claim 11, characterized in that a width of each character is greater than a width of the routing.

15. The display panel as claimed in claim 11, characterized in that a width of each character is smaller than a width of the routing.

16. The display panel as claimed in claim 11, characterized in that the characters are continuously disposed on the routing.

17. The display panel as claimed in claim 11, characterized in that the characters are separately disposed on the routing.

18. The display panel as claimed in claim 10, characterized in that each of the routings is a data line or a scan line.

* * * * *